United States Patent
Chang et al.

[11] Patent Number: 6,043,152
[45] Date of Patent: Mar. 28, 2000

[54] METHOD TO REDUCE METAL DAMAGE IN THE HDP-CVD PROCESS BY USING A SACRIFICIAL DIELECTRIC FILM

[75] Inventors: Weng Chang, Taipei; Syun-Ming Jang, Hsin-Chu, both of Taiwan

[73] Assignee: Taiwan Semiconductor Manufacturing Company, Hsin-Chu, Taiwan

[21] Appl. No.: 09/310,776

[22] Filed: May 14, 1999

[51] Int. Cl.$^7$ .................................................. H01L 21/28
[52] U.S. Cl. ..................... 438/680; 438/624; 438/641; 438/647; 438/674; 438/687; 438/744
[58] Field of Search ................................ 438/624, 641, 438/647, 674, 680, 687, 744

[56] References Cited

U.S. PATENT DOCUMENTS

| | | | |
|---|---|---|---|
| 4,732,761 | 3/1988 | Machida et al. | 437/228 |
| 5,451,543 | 9/1995 | Woo et al. | 437/195 |
| 5,674,783 | 10/1997 | Jang et al. | 437/195 |
| 5,679,606 | 10/1997 | Wang et al. | 437/195 |
| 5,686,356 | 11/1997 | Jain et al. | 437/195 |
| 5,702,981 | 12/1997 | Maniar et al. | 437/192 |
| 5,716,890 | 2/1998 | Yao | 438/624 |
| 5,858,869 | 1/1999 | Chen et al. | 438/597 |
| 5,891,799 | 8/1997 | Tsui | 438/618 |

*Primary Examiner*—Charles Bowers
*Assistant Examiner*—Lisa Kilday
*Attorney, Agent, or Firm*—George O. Saile; Stephen B. Ackerman

[57] ABSTRACT

Two approaches are proposed for forming an inter-metal dielectric layer with improved metal damage characteristics. This is of utmost importance for sub-quarter micron feature sizes, where thin metal lines are particularly susceptible to damage and where the HDP-CVD processes, which are used because of their excellent gap filling characteristics, are apt to cause metal damage. In approach one, a partially processed semiconductor wafer is provided containing a blanket layer of metal. A blanket dielectric layer is deposited. This layer could, for example, be silicone oxide, silicon nitride or silicone oxynitride; and the deposition process could be APCVD, LPCVD, 03-TEOS CVD or PECVD. The layer thickness could be in the range from about 0.01 microns to about 0.2 microns. Patterning and etching the blanket metal layer and protective dielectric layer results in the desired metal structure, except with a dielectric cap. The HDP-CVD insulating layer can now be deposited without concern for metal damage. In approach two, a protective dielectric is formed conformably over the patterned metal layer using processes that do not cause metal damage; examples of appropriate dielectrics and deposition processes are as listed in approach one. The gap filling capabilities of these processes cannot compare with that of HDP-CVD processes; however, since an HDP-CVD insulating will be deposited subsequently, this deficiency will be rectified. In either approach, damage to thin metal lines resulting from HDP-CVD processes is significantly reduced or eliminated thus increasing device yield and reliability.

8 Claims, 2 Drawing Sheets

METHOD TO REDUCE METAL DAMAGE IN THE HDP-CVD PROCESS BY USING A SACRIFICIAL DIELECTRIC FILM

BACKGROUND OF THE INVENTION

1. Field of the Invention

This invention relates generally to the fabrication of insulating layers for semiconductor devices and more particularly to a method of forming inter-metal dielectric (IMD) layers in a semiconductor device.

2. Description of the Prior Art

High-density plasma chemical vapor deposition (HDP-CVD) processes are particularly suited for deposition of insulating layers in VLSI and USLI technologies, and especially for sub-quarter-micron feature sizes. In addition to appropriate material properties, IMD layers should, ideally, completely fill all gaps between closely spaced metal lines and other metal regions, provide a planar upper surface and be formed at relatively low temperatures. HDP-CVD processes meet these requirements very well. The excellent gap filling characteristics of HDP-CVD IMD layers are well documented. These are particularly required for the high aspect ratio gaps resulting from closely spaced metal lines, prevalent in VLSI and ULSI technologies, which cannot be filled properly using more conventional processes. Insulating layers formed by HDP-CVD processes may require little subsequent planarization steps or none at all, even when deposited over highly irregular surfaces; whereas insulating layers formed on irregular surfaces using more conventional processes usually do require subsequent polarization steps, such as chemical mechanical polishing or etchback. These excellent gap filling and planarization characteristics accrue because in HDP-CVD deposition and etching are both occurring simultaneously. Yet the substrate temperature can be kept well below that where problems can arise, especially with aluminum metallurgy. Other desirable material properties, such as low dielectric constant and good ion gettering capabilities, can be achieved by an appropriate choice of material, for which a range of different materials have been produced using HDP-CVD.

However a major drawback exists in HDP-CVD processes; metal lines are often damaged in these processes leading to a reduced yield and reliability. A number of U.S. patents have addressed this drawback. In U.S. Pat. No. 5,679,606 to Wang et al. there is disclosed a method to reduce metal line damage in HDP-CVD by an in situ encapsulation of the metal lines and substrate with a protective oxide layer. This protective oxide layer is formed by the same electron cyclotron resonance technique as the rest of the insulating layer, and in the same apparatus, except that for the protective layer there is no argon flow. The absence of argon flow reduces the etching action of the process. Although this leads to a reduction in damage to metal lines, damage does still occur and is still a problem, especially for narrow lines. An essentially similar method of forming an IMD layer is shown in U.S. Pat. No. 5,686,356 to Jain et al., whose main point is that conductor reticulation leads to improved planarity when the IMD layer is formed by an HDP-CVD process. Machida et al., in U.S. Pat. No. 4,732, 761, also propose an in situ method wherein alternate layers are deposited within a plasma generating chamber. The first oxide layer is deposited using O2 and SiH4 gases and no bias power and then Ar is added to the gas flow with bias power turned on. These layers are alternated. Again, the absence of argon and bias power, while diminishing metal damage, does not eliminate it as an important yield and reliability detractor. This also can be asserted concerning the method for fabricating an IMD contained in U.S. Pat. No. 5,716,890 to Yao. A barrier (nucleation) layer is proposed as the first layer of a many element0 dielectric layer and an HDP-CVD process forms this first layer.

A method for improving the chemical-mechanical polish uniformity of insulating layers by Jang et al., U.S. Pat. No. 5, 674,783, incorporates a conformal insulating layer over a patterned layer, such as metal lines, and under an IMD layer. The growth rate of the overlying IMD layer is reduced over regions where the conformal insulating layer had been appropriately exposed to a plasma, and this effect is used to achieve an improved uniformity of the IMD layer, U.S. Pat. No. 5,451,543 to Woo et al. and U.S. Pat. No. 5,702,981 to Manier et al. show an insulating etch stop layer over a metal layer.

SUMMARY OF THE INVENTION

It is an object of this invention to provide a method for forming an HDP-CVD insulating layer with significantly reduced damage to underlying metal layers. The reduced damage is achieved by depositing a protective dielectric layer over the metal layer before the wafer is exposed to the plasma and sputter-etching environment. There are two approaches disclosed in the invention. In one approach the protective dielectric layer is deposited over the blanket metal layer, before metal patterning, using a benign deposition process. The protective dielectric layer and the metal layer are then patterned and etched together, followed by deposition of the HDP-CVD later. In the other approach, the protective dielectric layer is deposited conformably after metal patterning, using a benign deposition process. An HDP-CVD layer is then applied directly over the protective dielectric layer. Benign processes for the deposition of protective dielectric layers include APCVD, LPCVD, O3-TEOS CVD and PECVD.

Two approaches are proposed for forming an inter-metal dielectric layer with improved metal damage characteristics. This is of utmost importance for sub- quarter micron feature sizes, where thin metal lines are particularly susceptible to damage and where the HDP-CVD processes, which are used because of their excellent gap filling characteristics, are apt to cause metal damage. In approach one, a partially processed semiconductor wafer is provided containing a blanket layer of metal. A blanket dielectric layer is deposited. This layer could, for example, be silicone oxide, silicon nitride or silicone oxynitride; and the deposition process could be APCVD, LPCVD, O3-TEOS CVD or PECVD. The layer thickness could be in the range from about 0.01 microns to about 0.2 microns. Patterning and etching the blanket metal layer and protective dielectric layer results in the desired metal structure, except with a dielectric cap. The HDP-CVD insulating layer can now be deposited without concern for metal damage. In approach two, a protective dielectric is formed conformably over the patterned metal layer using processes that do not cause metal damage; examples of appropriate dielectrics and deposition processes are as listed in approach one. The gap filling capabilities of these processes cannot compare with that of HDP-CVD processes; however, since an HDP-CVD insulating will be deposited subsequently, this deficiency will be rectified. In either approach, damage to thin metal lines resulting from HDP-CVD processes is significantly reduced or eliminated thus increasing device yield and reliability.

BRIEF DESCRIPTION OF THE DRAWINGS

In the accompanying drawings, forming a material part of this description, there is shown.

DESCRIPTION OF THE PREFERRED EMBODIMENTS

Figure 1:
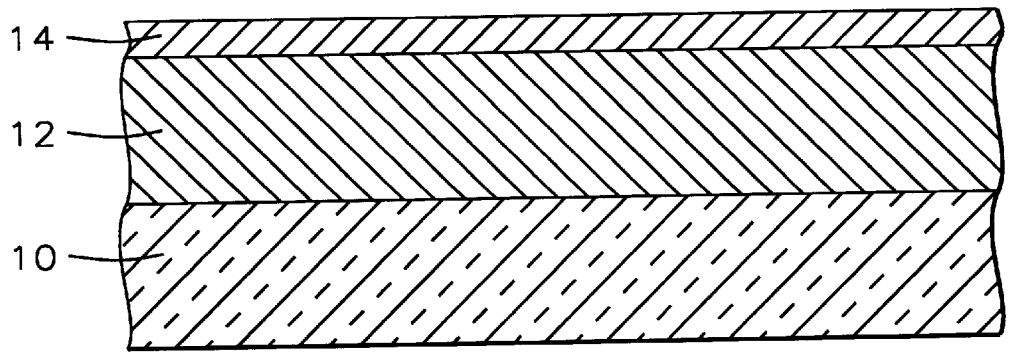
FIGS. 1 to 3 show the process flow according to approach one.

Referring to FIG. 1, depicting the start of the process flow according to approach one of this invention, a blanket metallic layer 12 is disposed over a partially processed semiconductor wafer, 10. This metallic layer could be aluminum, aluminum-copper, tungsten or polysilicon, for example. A protective insulating layer, 14, is deposited over the metallic layer. The protective layer could be doped or undoped silicon oxide, silicon nitride or silicon oxynitride, for example.

Figure 2:
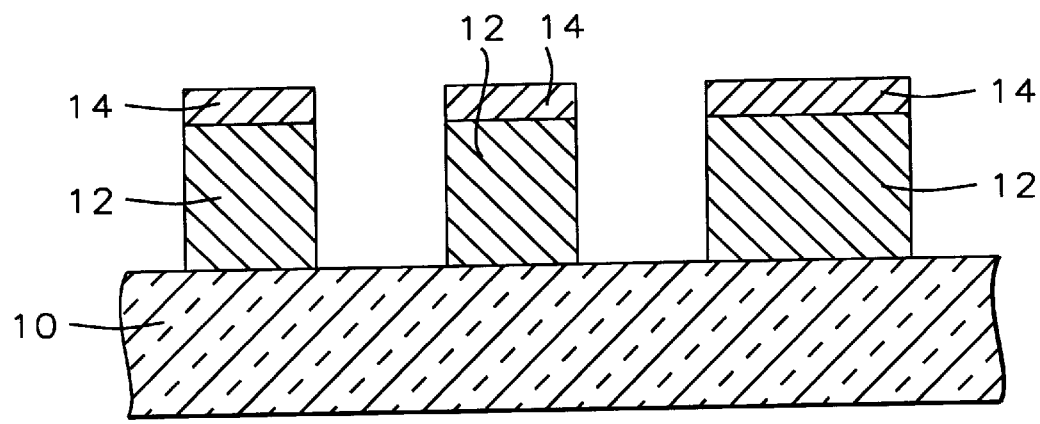

Layers 12 and 14 are patterned and etched to form the desired metal pattern, except that the metal has a protective insulating cap. This is shown in FIG. 2. Bounds for the thickness of the protective insulating layer are determined by the following considerations. The layer should be thick enough to adequately protect the metal from damage during the subsequent HDP-CVD dielectric layer deposition. An upper bound is set by the requirement that the aspect ratio, which is increased by the addition of the protective insulating cap, should be kept below the limit above which the HDP-CVD process cannot properly fill gaps. In the preferred embodiments of the first approach of the invention, the thickness of the protective insulating later should be between about 100 angstroms to about 2000 angstroms, with the most preferred thickness being about 100 angstroms. Deposition processes for the protective layer insulator depend on the metal. For SiO2 on Al, for instance, APCVD can be used at temperatures between about 300 to 450 degrees Celsius; the upper limit is because aluminum films cannot withstand temperatures above 450 degrees Celsius. The reactants are silane, SiH4, and O2 with flow rates of 150 and 1500 sccm, respectively. Step coverage is poor for SiO2 layers processed in this way, but that is not a deficit in this case where a blanket metal layer is being covered. PECVD can also be used for SiO2 on Al. Deposition temperatures are between 200 and 350 degrees Celsius; even lower then for APCVD. Reactants are either of the pairs, SiH4 and O2 or SiH4 and NO2; with flow rates of 150 and 1500 sccm for SiH4 and O2, respectively and of 150 and 1500 sccm for SiH4 and NO2, respectively; rf frequency is about 13.56 MHz; rf power is about 300 watts; pressure is 2 Torr. PECVD can also be used for low temperature deposition of silicon nitride, about 200 to 350 degrees Celsius, which is suitable for aluminum metallurgy. The reaction gases can either of the pairs, SiH4 and N2 or SiH4 and NH3, with flow rates of 280 and 4000 sccm for the SiH4, N2 pair, respectively and 280 and 110 sccm for the SiH4, NH3 pair, rf frequency is about 13.56 MHz; rf power is about 700 watts; pressure is 4 Torr. By reacting SiH4 with N2O and NH3, silicon oxynitride layers can also be formed at similar temperatures using PECVD. The flow rates are 69, 100 and 30 sccm for SiH4, N2O and NH3, respectively; rf frequency is about 13.56 MHz; rf power is about 150 watts; pressure is 4 Torr. LPCVD and O3-TEOS CVD are higher temperature processes which could be used, as can APCVD and PECVD, with metallurgies such as tungsten and polysilicon, which can withstand elevated temperatures. Deposition techniques for these processes are well known to those skilled in the art.

Figure 3:
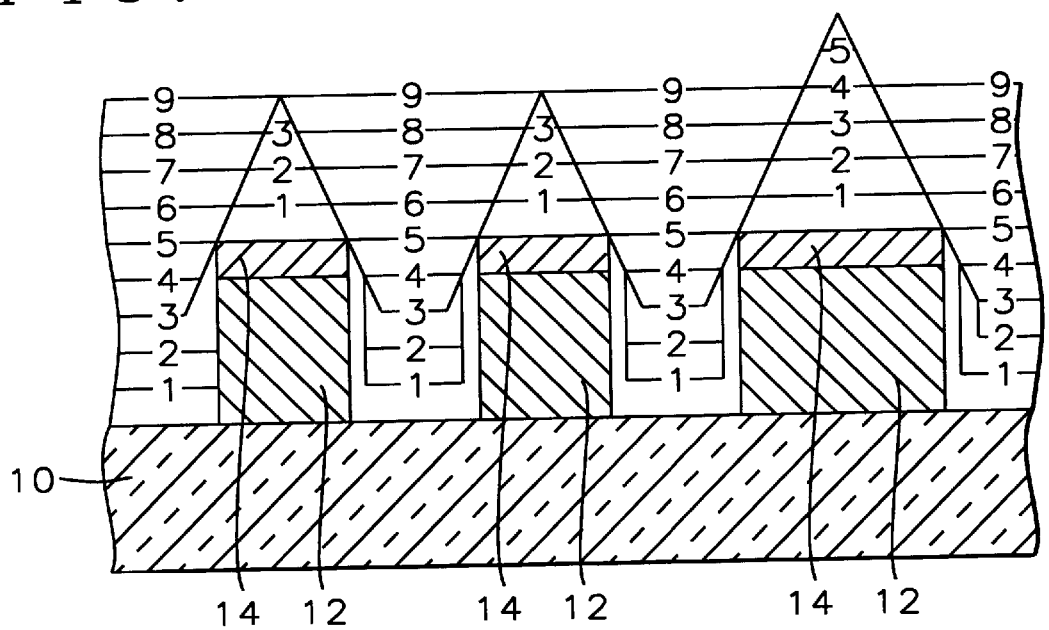

The next step in the process flow is to deposit a blanket HDP-CVD layer. In HDP-CVD deposition and sputter etching occur simultaneously. Excellent quality oxides are obtained even at low deposition temperature and by including argon in the gas flow and applying an rf bias to the substrate, even hard to fill high aspect ratio gaps can be filled with such excellent quality oxide without voids. Process parameters for the HDP-CVD layer could be: flow rates for O2, SH4 and Ar from about 130, 36, 50 sccm to about 160, 45, 60 sccm; rf frequency 13.56 MHz; rf power 6400 watts; bias power 2500 watts; pressure 6 mTorr; deposition temperature 400–420 degrees Celsius. Other insulators, such as doped silicon oxide, silicon nitride and silicon oxynitride, can also be deposited using HDP-CVD processes; the details are well known to those skilled in the art. Profiles of the HDP-CVD dielectric layer, as it is deposited, are indicated in FIG. 3, where the lines numbered 1 to 9 indicate the profiles and the same number labels lines belonging to a given profile. To achieve the same degree of planarization with the protective layer as without it, the HDP-CVD dielectric layer thickness should be increased by the thickness of the protective layer.

Figure 4:
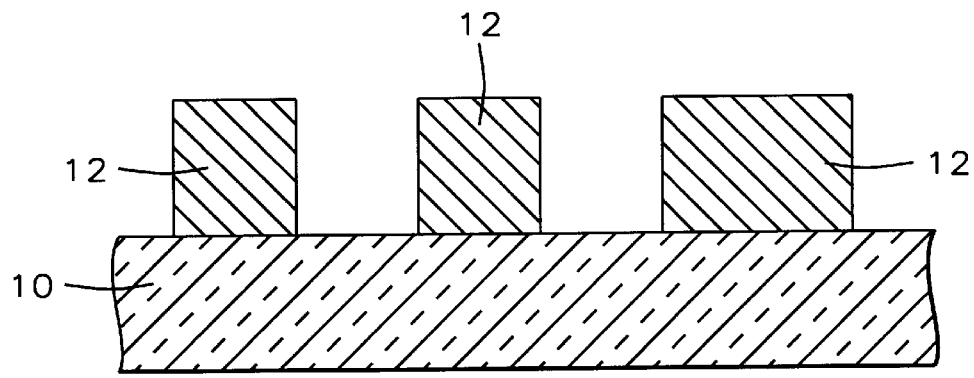
FIGS. 4 to 6 show the process flow according to approach two.
Figure 5:
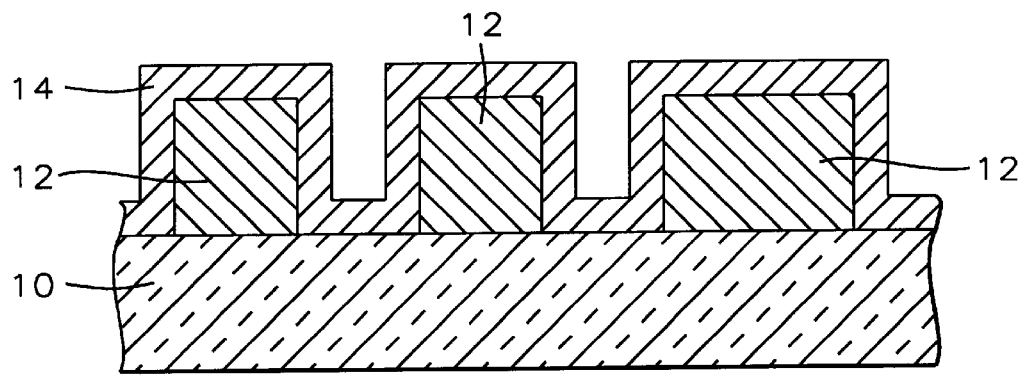

FIG. 4 depicts the starting point of approach two of the invention. The metal pattern, closely spaced lines and other regions, has already been formed in this approach. A protective insulating layer is then conformably deposited over the wafer, as shown in FIG. 5. As in approach one, the protective insulating layer must be sufficiently thick to provide protection to the underlying metal and not so thick that the increased aspect ratio affects the filling of the gaps. However, the protective layer increases the aspect ratio in approach two more than in approach one. The aspect ratio is the column height divided by the gap width. In approach one the height is increased by the thickness of the protective-insulating layer, while in approach two the gap width is decreased by twice the thickness of the protective-insulating layer. In the preferred embodiments of approach two of the invention, the thickness of the protective insulating later should be between about 100 angstroms to about 2000 angstroms, with the most preferred thickness being about 500 angstroms. Insulating materials and deposition processes applicable to approach one are also applicable to approach two, except that for approach two, good step coverage is desirable. Thus, for example, APCVD would not be used for SiO2 on aluminum because of poor step coverage.

Figure 6:
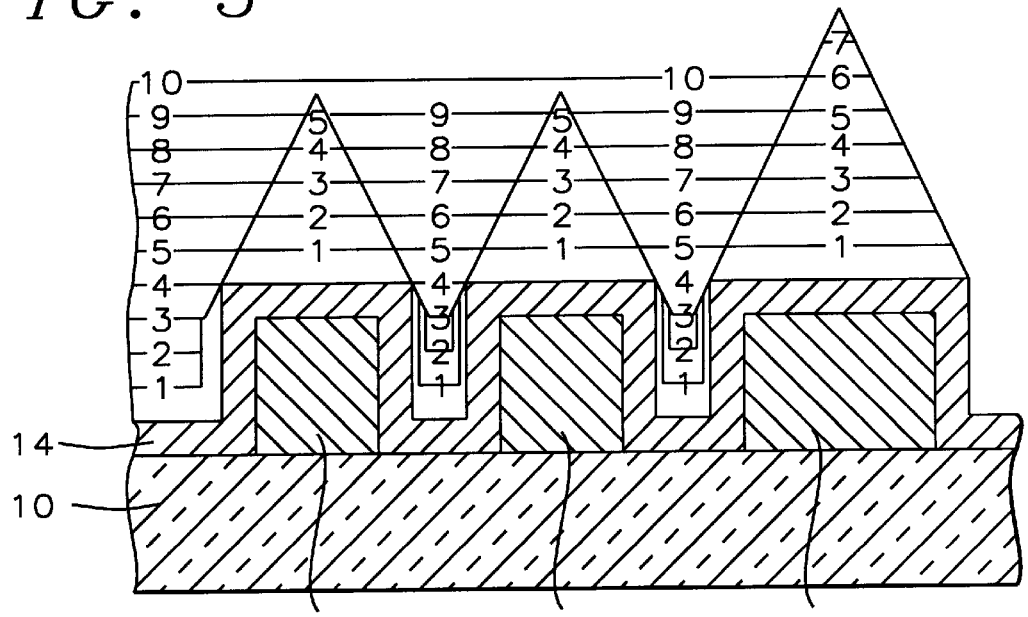

The next step in the process flow is the deposition of an HDP-CVD dielectric layer over the protective-insulating layer. The Profiles of the HDP-CVD dielectric layer, as it is deposited, are indicated in FIG. 6, where the lines numbered 1 to 9 indicate the profiles and the same number labels lines belonging to a given profile. The same degree of planarization is achieved with the protective layer as for a metal line without it, but wider by twice the protective insulator thickness. In approach one, the HDP-CVD dielectric layer thickness needs to be increased by the thickness of the protective layer to achieve the same degree of planarization.

While the invention has been particularly shown and described with reference to the preferred embodiments thereof, it will be understood by those skilled in the art that various changes in form and detail may be made without departing from the spirit and scope of the invention.

What is claimed is:

1. A method of forming an HPD-CVD dielectric layer with reduced damage to the underlying metallurgy, comprising:

provicing a partially processed semiconductor wafer having a blanket metallugical layer;

forming a blanket protective insulating layer over said metallurgical layer, wherein said blanket protective layer is composed of a material selected from the group consisting of silicon oxide, doped silicon oxide, and the deposition process being APCVD;

patterning and etching said insulating layer and said metallurgical layer;

forming a blanket HDP-CVD dielectric layer.

2. The method of claim 1 wherein said metallurgical layer is composed of a material selected from the group consisting of: Al, Al—Cu, W, and polysilicon.

3. The method of claim 1 wherein said protective insulating layer is composed of a material selected from the group consisting of: silicon oxide, doped silicon oxide, silicon nitride and silicon oxynitride.

4. The method of claim 1 wherein the deposition process for the protective insulating layer is PECVD.

5. The method of claim 1 wherein said metallurgical layer is composed of a material selected from the group consisting of: Al, Al—Cu and the deposition temperature is maintained below about 450 degrees Celsius.

6. The method of claim 1 wherein said metallurgical layer is composed of a material selected from the group consisting of: tungsten, polysilicon and the deposition process is LPCVD.

7. The method of claim 1 wherein said metallurgical layer is composed of a material selected from the group consisting of: tungsten, polysilicon and the deposition process is a process selected from the group consisting of APCVD, LPCVD, TEOS CVD, O3-TEOS CVD, PECVD.

8. The method of claim 1 wherein said HDP-CVD dielectric layer is composed of a material selected from the group consisting of: silicon oxide, doped silicon oxide, silicon nitride, silicon oxynitride.

* * * * *